(12) United States Patent
Choi et al.

(10) Patent No.: US 7,341,912 B2
(45) Date of Patent: Mar. 11, 2008

(54) SPLIT GATE FLASH MEMORY DEVICE HAVING SELF-ALIGNED CONTROL GATE AND METHOD OF MANUFACTURING THE SAME

(75) Inventors: Byung-yong Choi, Suwon-si (KR); Chang-woo Oh, Suwon-si (KR); Dong-gun Park, Seongnam-si (KR); Dong-won Kim, Seongnam-si (KR); Yong-kyu Lee, Guri-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/301,854

(22) Filed: Dec. 13, 2005

(65) Prior Publication Data

US 2006/0186460 A1    Aug. 24, 2006

(30) Foreign Application Priority Data

Feb. 23, 2005    (KR) ...................... 10-2005-0015041

(51) Int. Cl.
 *H01L 21/336* (2006.01)
(52) U.S. Cl. ............... 438/257; 438/267; 257/E21.422; 257/E21.681
(58) Field of Classification Search ............... 438/257, 438/267; 257/E21.681, E21.422, E29.3
 See application file for complete search history.

(56) References Cited

U.S. PATENT DOCUMENTS

| | | | |
|---|---|---|---|
| 5,492,846 A * | 2/1996 | Hara | 438/260 |
| 6,133,097 A | 10/2000 | Hsieh et al. | |
| 6,518,110 B2 * | 2/2003 | Wen | 438/201 |
| 6,589,842 B2 * | 7/2003 | Huang | 438/261 |
| 6,632,714 B2 | 10/2003 | Yoshikawa | |
| 6,798,015 B2 | 9/2004 | Kasuya | 257/316 |
| 6,855,602 B2 | 2/2005 | Chang et al. | |
| 7,037,783 B2 * | 5/2006 | Jeon et al. | 438/257 |
| 7,078,295 B2 * | 7/2006 | Jeon et al. | 438/261 |
| 2005/0208744 A1 * | 9/2005 | Jeon et al. | 438/593 |
| 2006/0008984 A1 * | 1/2006 | Jeon et al. | 438/257 |

FOREIGN PATENT DOCUMENTS

| | | |
|---|---|---|
| JP | 10-229136 | 8/1998 |
| KR | 10-2002-0044702 | 6/2002 |

* cited by examiner

*Primary Examiner*—Trung Dang
(74) *Attorney, Agent, or Firm*—Mills & Onello LLP

(57) ABSTRACT

In a flash memory device, which can maintain an enhanced electric field between a control gate and a storage node (floating gate) and has a reduced cell size, and a method of manufacturing the flash memory device, the flash memory device includes a semiconductor substrate having a pair of drain regions and a source region formed between the pair of drain regions, a pair of spacer-shaped control gates each formed on the semiconductor substrate between the source region and each of the drain regions, and a storage node formed in a region between the control gate and the semiconductor substrate. A bottom surface of each of the control gates includes a first region that overlaps with the semiconductor substrate and a second region that overlaps with the storage node. The pair of spacer-shaped control gates are substantially symmetrical with each other about the source region.

18 Claims, 8 Drawing Sheets

SPLIT GATE FLASH MEMORY DEVICE HAVING SELF-ALIGNED CONTROL GATE AND METHOD OF MANUFACTURING THE SAME

BACKGROUND OF THE INVENTION

This application claims the priority of Korean Patent Application No. 10-2005-0015041, filed on Feb. 23, 2005, in the Korean Intellectual Property Office, the disclosure of which is incorporated herein in its entirety by reference.

1. Field of the Invention

The present invention relates to a flash memory device and a method of manufacturing the same, and more particularly, to a split gate flash memory device having a self-aligned control gate and a method of manufacturing the same.

2. Description of the Related Art

Non-volatile semiconductor devices electrically store and erase data and can retain data even when power is turned off. Accordingly, non-volatile semiconductor devices enjoy widespread use in various fields, including portable electronics.

As one type of non-volatile memory device, a split gate flash memory device includes a floating gate (or a storage node) and a control gate that are separated from each other. The floating gate is electrically isolated from the external environment, and stores information using-the characteristic that the current of a memory cell varies according to electron injection (writing) to the floating gate and electron removal from the floating gate (deleting). For example, electron injection to the floating gate is conducted by channel-hot electron injection (HEI), and electron removal from the floating gate is conducted by Fowler-Nordheim (F-N) tunneling through an inter-gate insulating layer that is present between the floating gate and the control gate.

Referring to FIG. 1, a conventional split gate flash memory device includes a floating gate 15 and a control gate 20, which are disposed between a source region 25a and a drain region 25b. The control gate 20 and the floating gate 15 share a portion of a substrate 10, that is, a channel region between the source and drain regions 25a and 25b, respectively, and the control gate 20 surrounds a sidewall and lies on a portion of a top surface of the floating gate 15.

By forming the control gate 20 in this manner, an electric field between the floating gate 15 and the control gate 20 is enhanced, and the problem of punch-through between the source and drain regions 25a and 25b can be solved. Such a split gate flash memory device is disclosed in U.S. Pat. No. 5,067,108.

In the split gate flash memory device, as the control gate 20 is formed by an individual patterning process, an overlap area between the control gate 20 and the channel region varies from chip to chip, lot to lot, or wafer to wafer. Accordingly, cell threshold voltage and device characteristics vary from chip to chip, lot to lot, or wafer to wafer.

Further, since the control gate 20 and the floating gate 15 are formed on the same plane to share the channel region, the cell size of the split gate flash memory device is about 50% larger than that of a stack type flash memory device. Accordingly, it is more difficult to scale down the split gate flash memory device as compared to the stacked flash memory device.

SUMMARY OF THE INVENTION

The present invention provides a flash memory device that can maintain an enhanced electric field between a control gate and a storage node (floating gate) while reducing the cell size.

The present invention further provides a flash memory device which can reduce the cell size and maintain a uniform overlap length between a channel region and each of a control gate and a storage node (floating gate).

The present invention also provides a method of manufacturing such a flash memory device.

According to an aspect of the present invention, there is provided a flash memory device comprising: a semiconductor substrate having a source region and a drain region that are spaced apart from each other; a spacer-shaped control gate formed between the source region and the drain region of the semiconductor substrate; and a storage node formed on a region between the control gate and the semiconductor substrate.

In one embodiment, a bottom surface of the control gate includes a first region that overlaps with the semiconductor substrate and a second region that overlaps with the storage node.

In another embodiment, the device further comprises an insulating layer between the storage node and the control gate and between the storage node and the semiconductor substrate. In another embodiment, the device further comprises an insulating layer between the first region of the control gate and the semiconductor substrate. In another embodiment, the device further comprises silicide layers formed on the control gate and the source and drain regions.

In another embodiment, the control gate comprises: a first conductive spacer disposed on the storage node; and a second conductive spacer disposed on a sidewall of the first conductive spacer. In another embodiment, the device further comprises an insulating layer interposed between the first conductive spacer and the second conductive spacer. In another embodiment, the device further comprises a silicide layer formed on the control gate to connect the first conductive spacer and the second conductive spacer.

In another embodiment, the control gate comprises: a first conductive spacer disposed on the storage node; and second conductive spacers disposed on both sidewalls of the first conductive spacer. In another embodiment, the device further comprises an insulating layer interposed between the first conductive spacer and each of the second conductive spacers that are disposed on both sidewalls of the first conductive spacer. In another embodiment, the device further comprises a silicide layer formed on the control gate to connect the first conductive spacer and the second conductive spacers.

In another embodiment, the storage node is closer to the source region than to the drain region.

In another embodiment, the storage node comprises a material selected from the group consisting of silicon nitride, polysilicon, silicon dot, silicon germanium, and nano crystal.

According to another aspect of the present invention, there is provided a flash memory device comprising: a semiconductor substrate having a pair of drain regions and a source region formed between the pair of drain regions; a pair of spacer-shaped control gates each formed on the semiconductor substrate between the source region and each of the drain regions; and a storage node formed in a predetermined portion between each control gate and the semiconductor substrate, wherein a bottom surface of each control gate includes a first region that overlaps with the semiconductor substrate and a second region that overlaps with the storage node, wherein the pair of spacer-shaped control gates are substantially symmetrical with each other about the source region.

In one embodiment, the flash memory device may further comprise an insulating layer interposed between the storage node and the control gate and between the storage node and the semiconductor substrate. The flash memory device may further comprise an insulating layer between the first region of the control gate and the semiconductor substrate.

In another embodiment, each of the control gates may comprise: a first conductive spacer disposed on the storage node; and a second conductive spacer disposed on a sidewall of the first spacer. The flash memory device may further comprise an insulating layer interposed between the first conductive spacer and the second conductive spacer. The flash memory device may further comprise a silicide layer formed on the control gate to connect the first conductive spacer and the second conductive spacer.

In another embodiment, each of the control gates may comprise: a first conductive spacer disposed on the storage node; and second conductive spacers disposed on both sidewalls of the first conductive spacer. The flash memory device may further comprise an insulating layer between the first conductive spacer and each of the second conductive spacers that are disposed on both the sidewalls of the first conductive spacer. The flash memory device may further comprise a silicide layer formed on the control gate to connect the first conductive spacer and the second conductive spacers.

In another embodiment, each storage node may be closer to the source region than to the corresponding drain region.

According to still another aspect of the present invention, there is provided a method of manufacturing a flash memory device, the method comprising: forming a storage node layer on a semiconductor substrate; forming a dummy layer within the storage node layer to separate the storage node layer into at least two storage nodes; and forming spacer-shaped control gates on both sidewalls of the dummy layer so that each control gate covers a sidewall and a top surface of a corresponding storage node.

In one embodiment, a semiconductor tunnel oxide layer, a storage node layer, a first gate insulating layer, and a damascene molding layer are sequentially stacked. A dummy layer is formed using a damascene method so that the dummy layer partially passes through the damascene molding layer, the gate insulating layer, the storage node layer and the tunnel oxide layer. Dummy spacers are formed on both sidewalls of the dummy layer. The gate insulating layer, the storage node layer, and the tunnel oxide layer are etched using the dummy spacers as masks, thereby defining the storage node. The dummy spacers are removed. A second gate insulating layer is formed on the resultant semiconductor substrate. Conductive spacers are formed on the sidewalls of the dummy layer and the storage node, thereby forming control gates. The dummy layer is removed. A lightly doped impurity and a pocket impurity are implanted into exposed portions of the semiconductor substrate, and insulating spacers are formed on both sides of the second conductive spacers. A heavily doped impurity is implanted into the semiconductor substrate outside the insulating spacers, thereby forming source and drain regions.

In another embodiment, a semiconductor tunnel oxide layer, a storage node layer, a first gate insulating layer, and a damascene molding layer are sequentially stacked. A dummy layer is formed using a damascene method so that the dummy layer partially passes through the damascene molding layer, the gate insulating layer, the storage node layer, and the tunnel oxide layer. First conductive spacers are formed on sidewalls of the dummy layer. The gate insulating layer, the storage node layer, and the tunnel oxide layer are etched using the first conductive spacers as masks, thereby defining the storage node. A second gate insulating layer is formed on the resultant semiconductor substrate. Second conductive spacers are formed on the sidewalls of the first conductive spacers and the storage node, thereby forming control gates. The dummy layer is removed. A lightly doped impurity and a pocket impurity are implanted into exposed portions of the semiconductor substrate, and insulating spacers are formed on both sides of the second conductive spacers. A heavily doped impurity is implanted into the semiconductor substrate outside the insulating spacers, thereby forming source and drain regions. First silicide layers are formed to electrically connect the first and second conductive spacers, and at the same time second silicide layers are formed on the source and drain regions.

In another embodiment, a semiconductor tunnel oxide layer, a storage node layer, a first gate insulating layer, and a damascene molding layer are sequentially stacked. A dummy layer is formed using a damascene method so that the dummy layer partially passes through the damascene molding layer, the gate insulating layer, the storage node layer, and the tunnel oxide layer. First conductive spacers are formed on sidewalls of the dummy layer. The gate insulating layer, the storage node layer, and the tunnel oxide layer are etched using the first conductive spacers as masks, thereby defining the storage node. The dummy layer is removed. A second gate insulating layer is formed on the resultant semiconductor substrate. Second conductive spacers are formed on both sidewalls of the first conductive spacers and the storage node, thereby forming control gates. The dummy layer is removed. A lightly doped impurity and a pocket impurity are implanted into exposed portions of the semiconductor substrate, and insulating spacers are formed on both sides of the second conductive spacers. A heavily doped impurity is implanted into the semiconductor substrate outside the insulating spacers, thereby forming source and drain regions. First silicide layers are formed to electrically connect the first and second conductive spacers, and at the same time second silicide layers are formed on the source and drain regions.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
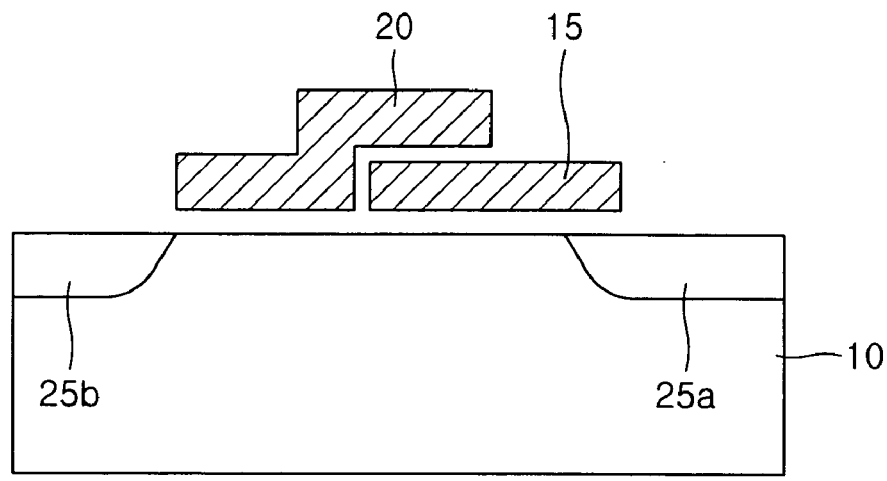
FIG. 1 is a cross-sectional view of a conventional split gate flash memory device.

The present invention will now be described more fully with reference to the accompanying drawings, in which preferred embodiments of the invention are shown. The invention may, however, be embodied in many different forms and should not be construed as being limited to the embodiments set forth herein. Rather, these embodiments are provided so that this disclosure will be thorough and complete. In the drawings, the thicknesses of layers and regions and the sizes of components may be exaggerated for clarity, and the same elements are given the same reference numerals throughout the drawings.

FIGS. 2A through 2E are cross-sectional views illustrating a method of manufacturing a flash memory device according to an embodiment of the present invention.

Figure 2A:
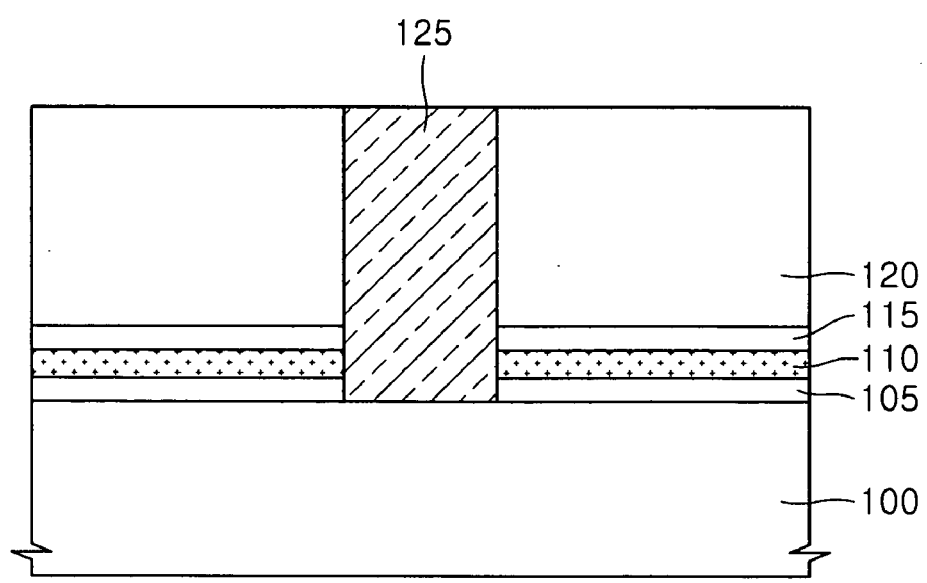
FIGS. 2A through 2G are cross-sectional views illustrating a method of manufacturing a flash memory device according to an embodiment of the present invention.

Referring to FIG. 2A, a tunnel oxide layer 105, a storage node 110, and a first gate insulating layer 115 are sequentially deposited on a semiconductor substrate 100. The semiconductor substrate 100 comprises, for example, a bulk silicon substrate or a silicon-on-insulator (SOI) substrate. The tunnel oxide layer 105 and the first gate insulating layer 115 comprise, for example, silicon oxide layers. The storage node 110 may be a silicon nitride layer, a polysilicon layer, a silicon dot layer, a silicon germanium (SiGe) layer, or a nano crystal layer, and operates as a floating gate. A damascene molding layer 120 is deposited on the gate insulating layer 115. Thereafter, the damascene molding layer 120, the first gate insulating layer 115, the storage node 110, and the tunnel oxide layer 105 are partially etched to form a hole. A dummy layer 125 is deposited on the damascene molding layer 120 to fill the hole, and then the dummy layer 125 is buried in the hole using a planarization process, such as a chemical mechanical polishing process or an etch back process, to expose a surface of the damascene molding layer 120. The damascene molding layer 120 and the dummy layer 125 can have a different etching selectivity, and the dummy layer 125 is easily selectively removed by wet etching. The damascene molding layer 120 of the present embodiment comprise, for example, a silicon nitride layer, and the dummy layer 125 may be a silicon oxide layer.

Figure 2B:
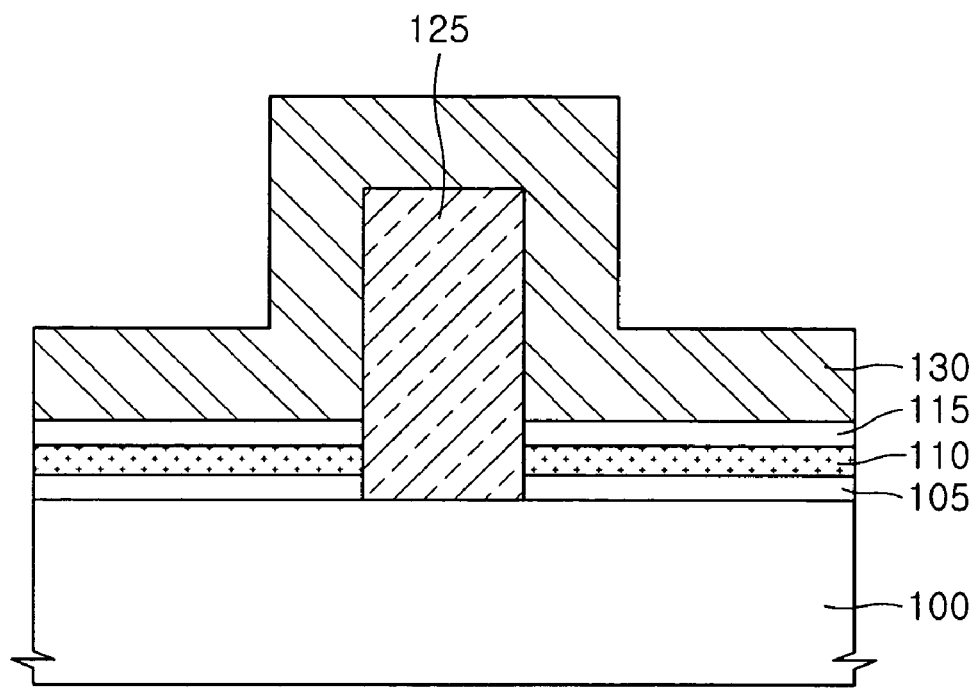

Referring to FIG. 2B, the damascene molding layer 120 is selectively removed, and a conductive layer 130 is deposited to a predetermined thickness on the first gate insulating layer 115 and the dummy layer 125.

Figure 2C:
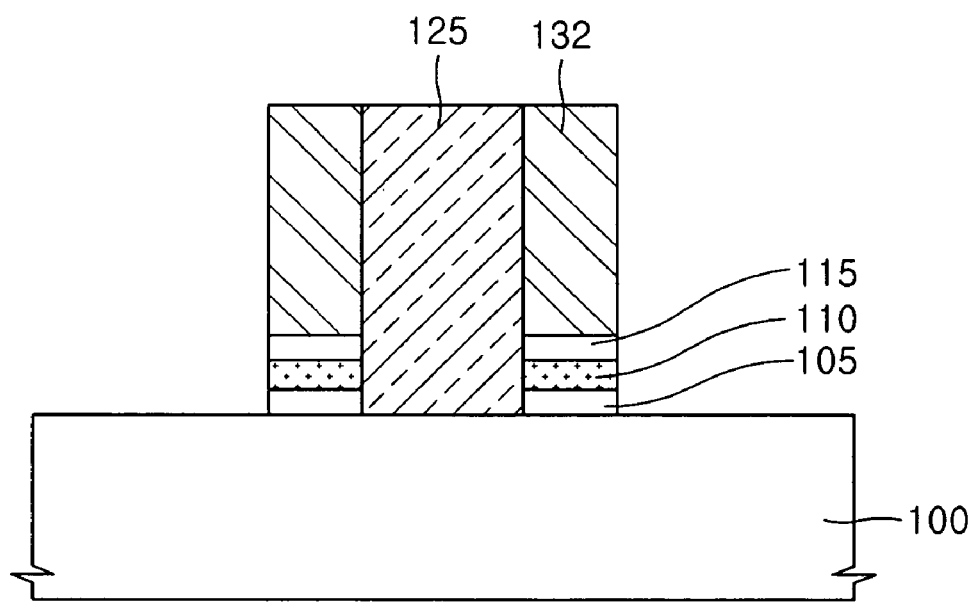

Referring to FIG. 2C, the conductive layer 130 is anisotropically etched to expose a top surface of the damascene molding layer 125, thereby forming first conductive spacers 132 on both sidewalls of the patterned dummy layer 125. Next, the gate insulating layer 115, the storage node 110, and the tunnel oxide layer 105 are etched using the first conductive spacers 132 as masks to separate the storage node 110 into discrete portions.

Figure 2D:
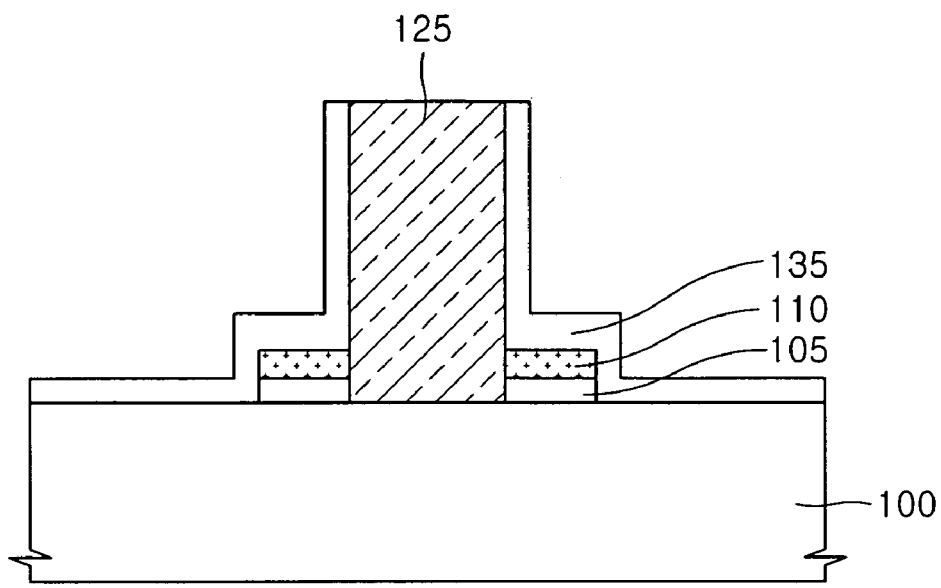

Referring to FIG. 2D, the first conductive spacers 132 are removed using conventional removal techniques, and then a second gate insulating layer 135 is deposited on the resultant semiconductor substrate 100. The second gate insulating layer 135 may comprise, for example, the same material as that of the first gate insulating layer 115.

Figure 2E:
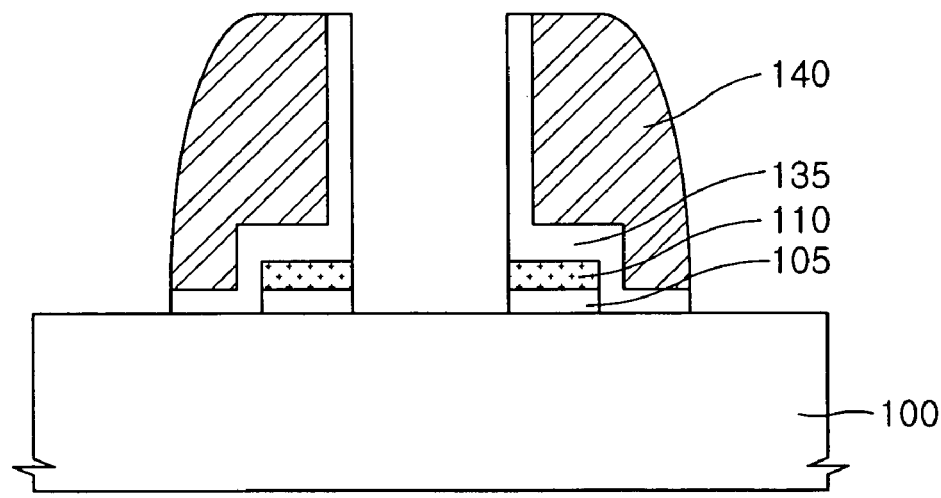

Referring to FIG. 2E, a conductive layer for a gate electrode is deposited on the second gate insulating layer 135 and the dummy layer 125. The conductive layer for gate electrode may be a doped polysilicon layer or a transition metal silicide layer. Next, the conductive layer for the gate electrode is anisotropically etched to expose a surface of the dummy layer 125, thereby forming second conductive spacers 140 on sidewalls of the dummy layer 125 coated with the second gate insulating layer 135. The second conductive spacers 140 of the present embodiment function as control gates. As the second conductive spacers 140 are formed on both the sidewalls of the patterned dummy layer 125 using a spacer-etching method, the second conductive spacers 140 are self-aligned without an additional photolithography process. Thereafter, the dummy layer 125 is removed. Here, the dummy layer 125 may be selectively removed using wet etching.

Figure 2F:
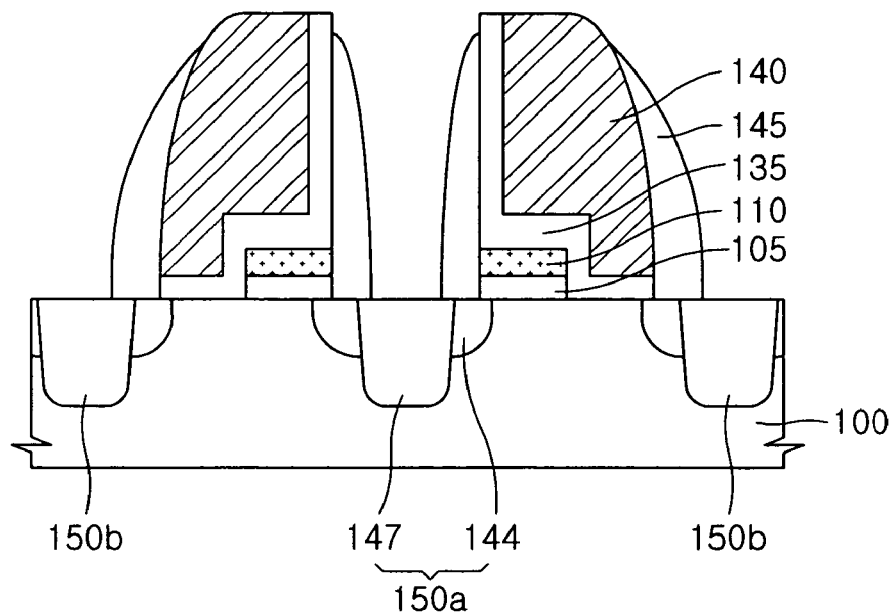

Referring to FIG. 2F, a lightly doped impurity and a pocket impurity opposite in conductivity to the semiconductor substrate 100 are implanted into portions of the semiconductor substrate 100 using the second conductive spacers 140 as a mask. Next, insulating spacers 145 are formed on both sidewalls of the second conductive spacers 140 using a well-known method, and then a heavily doped impurity is implanted into exposed portions of the semiconductor substrate 100. Consequentially, drain regions 150b and a source region 150a are formed, each of which includes a lightly doped impurity region 144, a pocket impurity region (not shown), and a heavily doped impurity region 147.

Figure 2G:
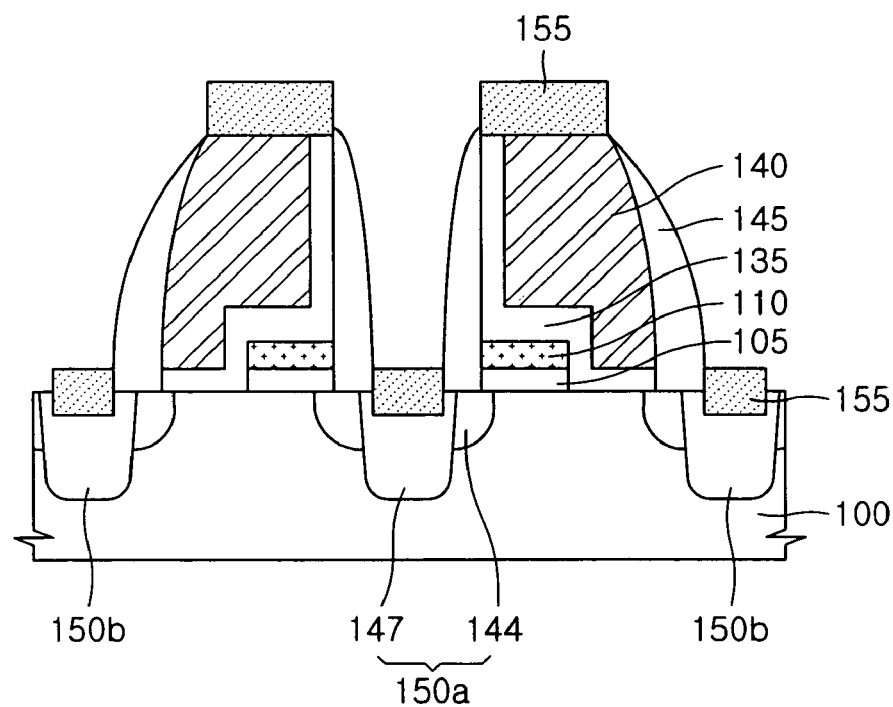

Referring to FIG. 2G, a transition metal layer (not shown) is deposited on the resultant semiconductor substrate 100, and then the transition metal layer is annealed to form silicide layers 155, which operate as ohmic contacts, on the second spacers 140 and the source and drain regions 150a and 150b, respectively. The silicide layers 155 are optional.

According to the present embodiment illustrated in FIGS. 2A through 2G, the second conductive spacers 140, that is, control gates, are formed on both the sidewalls of the dummy layer 125 using a spacer-etching method such that the second conductive spacers 140 are self-aligned. As a result, an overlap area between each of the control gates 140 and the channel region is constant from chip to chip, lot to lot, and wafer to wafer.

Furthermore, since each of the spacer-shaped control gates 140 is formed to surround a top surface and a sidewall of each storage node (floating gate) 110 similar to that of a conventional split gate structure, an enhanced electric field and a source side injection (SSI), which leads to charge injection into the storage node at the source side, can be maintained.

Figure 3A:
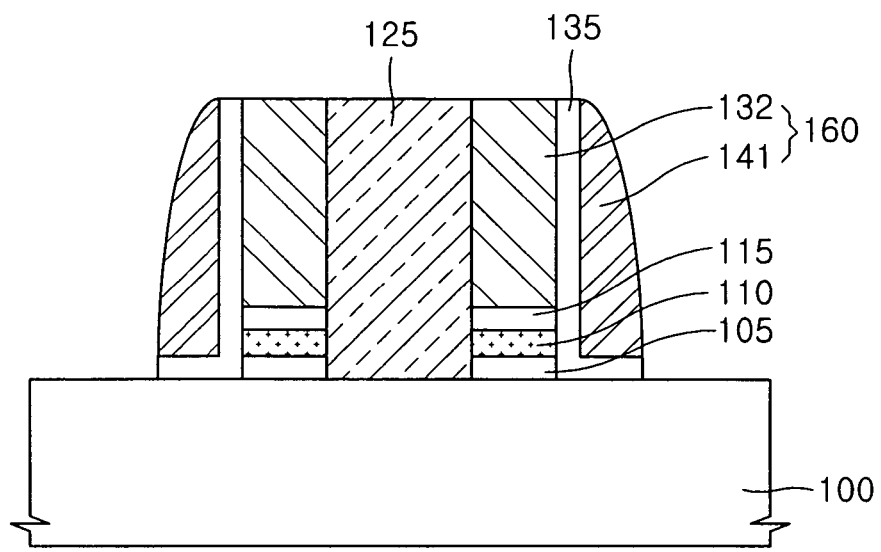
FIGS. 3A through 3C are cross-sectional views illustrating a method of manufacturing a flash memory device according to another embodiment of the present invention.
Figure 3B:
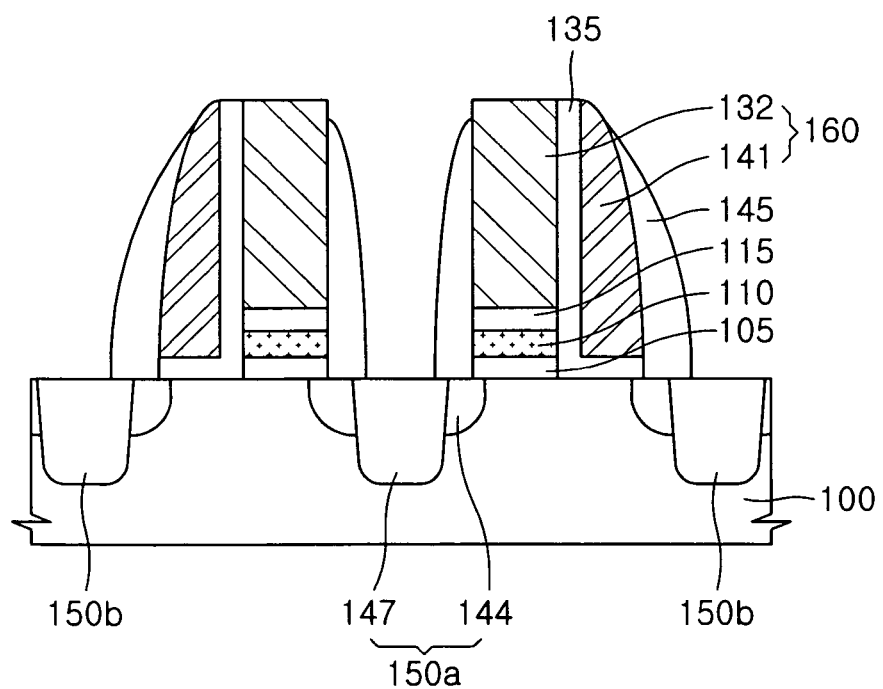
Figure 3C:
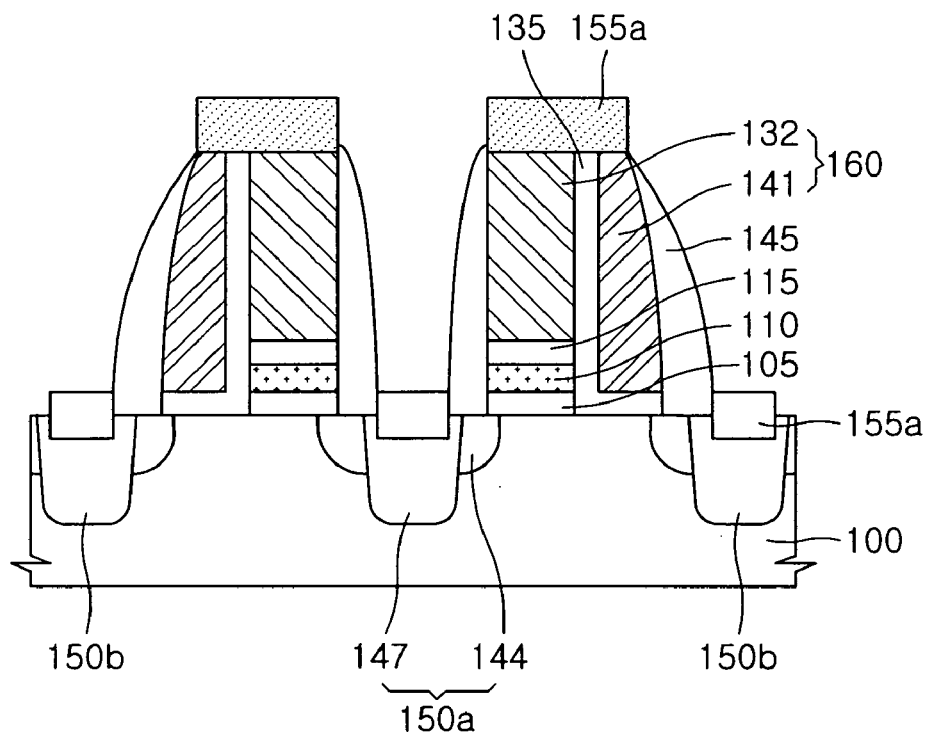

FIGS. 3A through 3C are cross-sectional views illustrating a method of manufacturing a flash memory device according to another embodiment of the present invention. The embodiment illustrated in FIGS. 3A through 3C undergoes the same operations as shown in FIGS. 2A, 2B, and 2C, and thus to eliminate redundancy, operations thereafter will now be explained below.

In the present embodiment illustrated in FIGS. 3A through 3C, the first conductive spacers 132 are used as control gates. In detail, referring to FIG. 3A, a second gate insulating layer 135 and a conductive layer for a gate electrode are deposited on the resultant semiconductor substrate 100 on which the first conductive spacers 132 are formed. Each of the first conductive spacers 132 and the conductive layer for the gate electrode comprises, for example a doped polysilicon layer, a transition metal silicide layer or a transition metal layer. Next, the conductive layer for gate electrode and the second gate insulating layer 135 are anisotropically etched to expose the dummy layer 125, thereby forming second conductive spacers 141 on sidewalls of the first conductive spacers 132.

Referring to FIG. 3B, the dummy layer 125 is removed using a well-known method. Next, a lightly doped impurity and a pocket impurity are implanted into portions of the semiconductor substrate 100 outside the first and second conductive spacers 132 and 141, respectively. Next, insulating spacers 145 are formed using well-known techniques on sidewalls of the first conductive spacers 132 and the second conductive spacers 141. Thereafter, a heavily doped impurity is implanted into exposed portions of the semiconductor substrate 100 to form source and drain regions 150a and 150b, respectively, each of which includes a light doped impurity region 144, a pocket impurity region (not shown), and a heavily doped impurity region 147.

Next, to operate the respective first and second conductive spacers 132 and 141 as one control gate, a transition metal layer (not shown) is deposited on the resultant semiconductor substrate 100. Next, the transition metal layer is annealed. Referring to FIG. 3C, first transition metal silicide layers 155a, which connect the first and second conductive spacers 132 and 141, and second transition metal silicide layers 155b, which are formed on the source and drain regions 150a and 150b, respectively, are formed, and remaining transition metal layers are removed. Here, although a gate insulating layer 135 is interposed between the first conductive spacer 132 and the second conductive spacer 141, the gate insulating layer 135 is relatively thin and the first and second conductive spacers 132 and 141, respectively, electrically communicate with each other due to the first transition metal silicide layer 155a, such that the same voltage is applied to the first and second conductive spacers 132, 141.

FIGS. 4A through 4E are cross-sectional views illustrating a method of manufacturing a flash memory device according to still another embodiment of the present invention. Since the present embodiment illustrated in FIGS. 4A through 4E undergoes the same operations as those in FIGS. 2A through 2C, operations thereafter will now be explained.

Figure 4A:
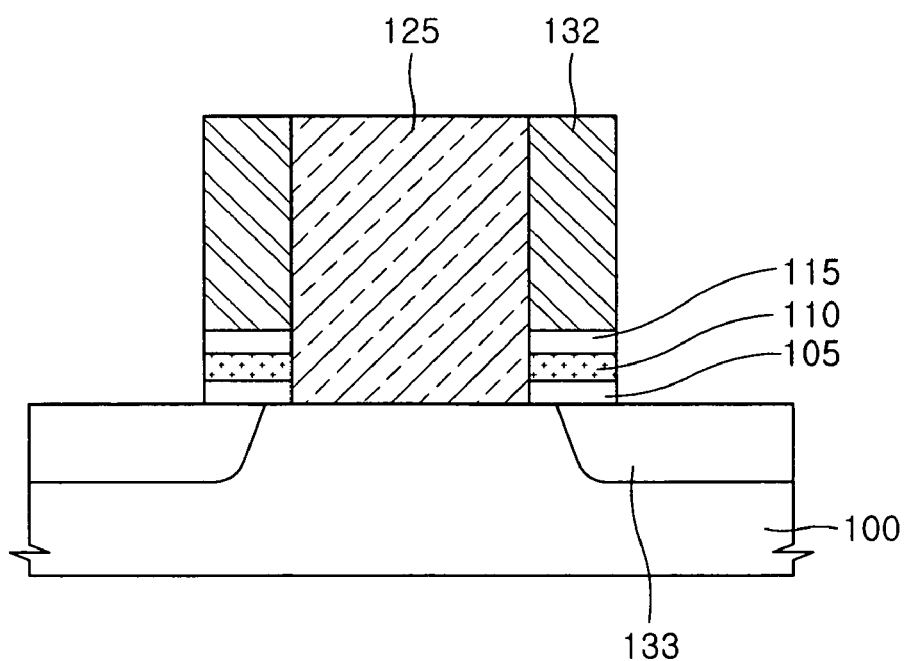
FIGS. 4A through 4E are cross-sectional views illustrating a method of manufacturing a flash memory device according to still another embodiment of the present invention.

Referring to FIG. 4A, the storage node 110 is divided into discrete regions by patterning using the first conductive spacers 132 as masks. Thereafter, an impurity opposite in conductivity to that of source and drain regions, which are to be formed later, is implanted into exposed portions of the semiconductor substrate 100, which are to be drain and channel regions, to form counter doping layers 133. The counter doping layers 133 in the drain regions prevent lateral diffusion of the impurity for the drain region, and the counter doping layer 133 in the source region induces lateral diffusion of the impurity for the source region. The counter doping layers 133 implant charge into the storage node 110 at the source region side. The counter doping layers 133 may be selectively formed after the operation of FIG. 2C in the above embodiments.

Figure 4B:
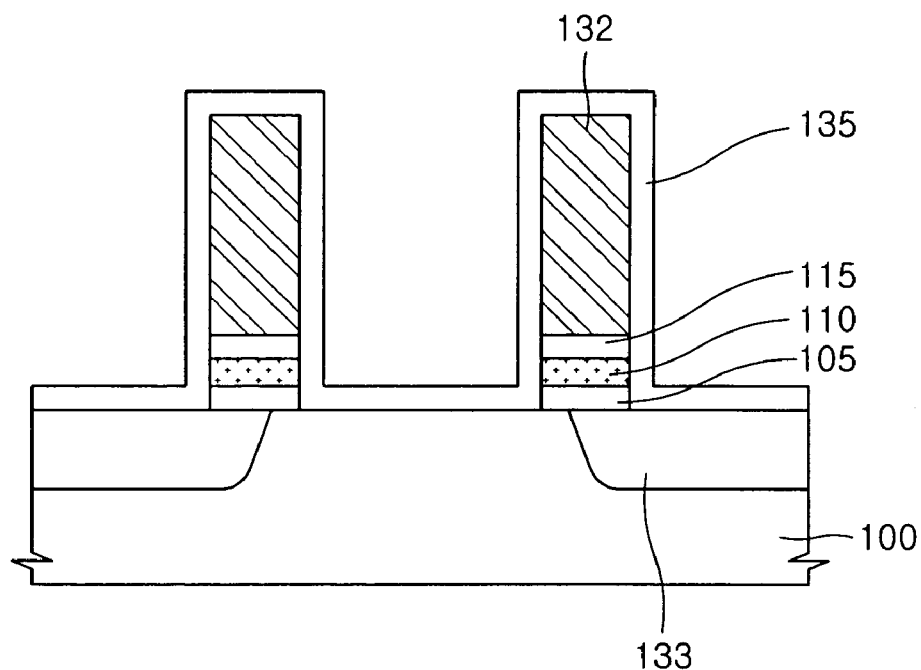

Referring to FIG. 4B, the patterned dummy layer 125 is removed, and then a second gate insulating layer 135 is deposited on a surface of the resultant structure.

Figure 4C:
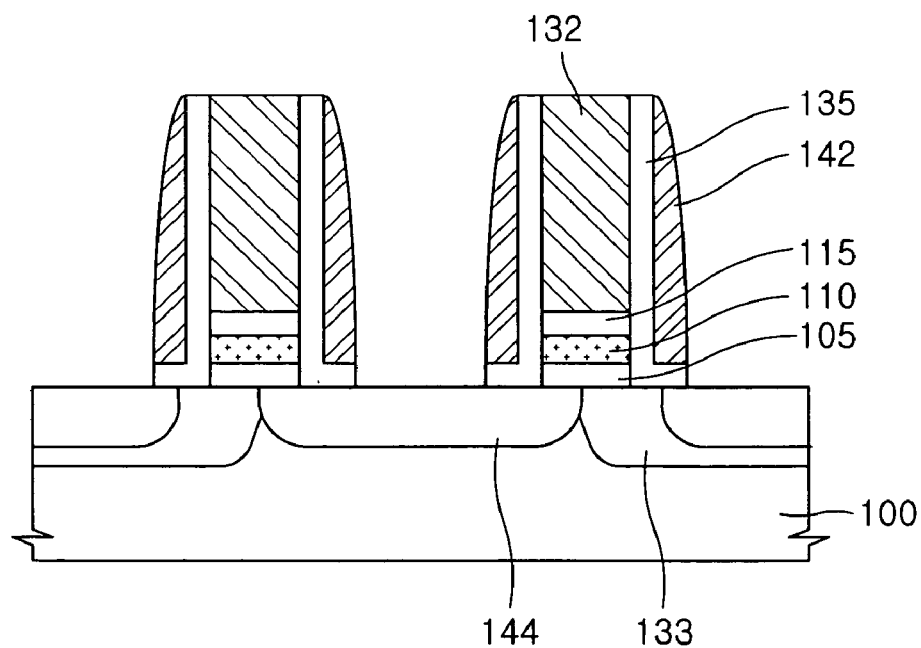

Referring to FIG. 4C, a conductive layer for a gate electrode is deposited on the second gate insulating layer 135. Next, the conductive layer for the gate electrode and the second gate insulating layer 135 are anisotropically etched to expose top surfaces of the first conductive spacers 132, thereby forming second conductive spacers 142 on both sidewalls of the first conductive spacers 132. Thereafter, a lightly doped impurity is implanted into an exposed portion of the semiconductor substrate 100 outside the second conductive spacers 142 to form a light doped impurity region 144. Here, the lightly doped impurity region 144 of the source region can overlap with the storage node 110.

Figure 4D:
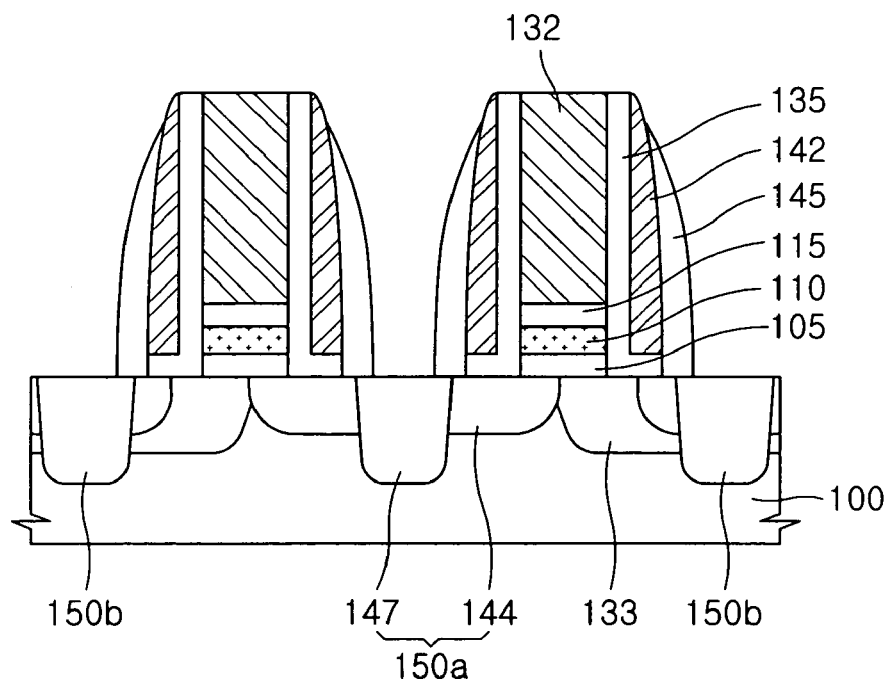

Referring to FIG. 4D, an insulating layer is deposited on the resultant semiconductor substrate 100 in which the lightly doped impurity region 144 is formed, and the insulating layer is anisotropically etched to form insulating spacers 145 on sidewalls of the second conductive spacers 142. Subsequently, a heavily doped impurity is injected into exposed portions of the semiconductor substrate 100 to form a heavily doped impurity region 147 and define source and drain regions 150a and 150b.

Figure 4E:
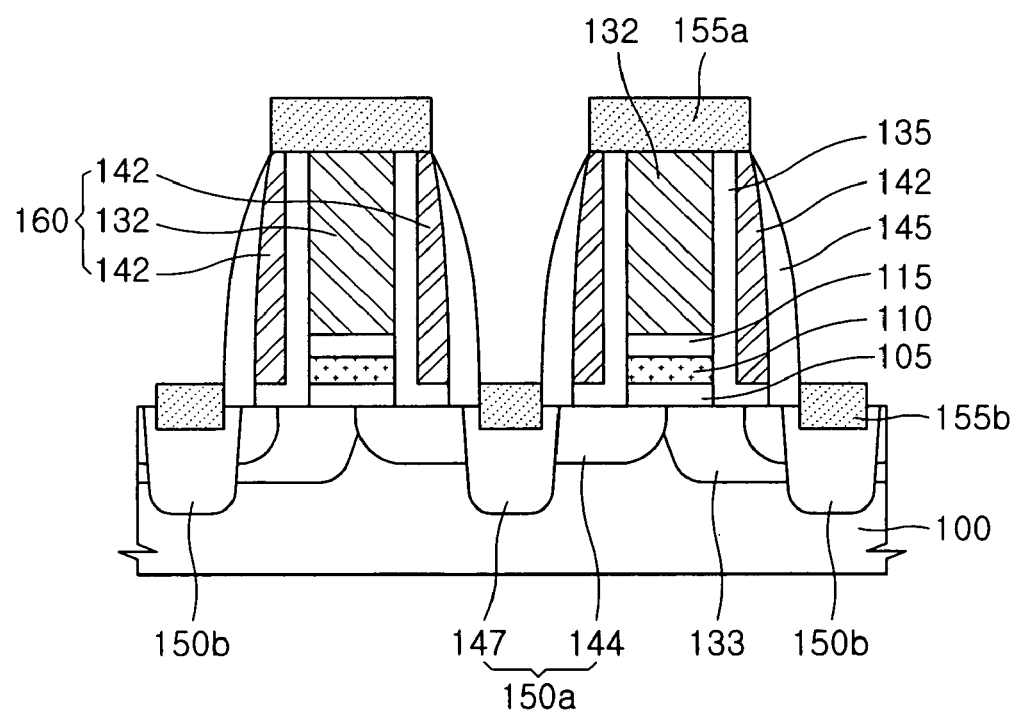

Next, a transition metal layer (not shown) is deposited on the resultant semiconductor substrate 100 to electrically connect the first conductive spacer 132 and the second conductive spacers 142 disposed on both the sidewalls of the first conductive spacer 132 so that the first and second conductive spacers 132 and 142 can form one control gate. After that, the transition metal layer is annealed. Referring to FIG. 4E, first metal silicide layers 155 connecting the respective first and second conductive spacers 132 and 142 and second transition metal silicide layers 155b formed on the source and drain regions 150a and 150b, respectively, are formed and remaining transition metal layers are removed.

Since the control gates of the present embodiment surround a top surface and both sides of the storage node, an electric field applied to the control gates can be enhanced.

As described above, according to the present invention, a patterned dummy layer is formed using a damascene method and control gates are formed using a spacer-etching method on both sides of the dummy layer. Accordingly, the control gates can be self-aligned, and thus a uniform channel overlap area from chip to chip, lot to lot, and wafer to wafer can be achieved.

Since the control gates cover a top surface and a sidewall of a storage node similar to a conventional split gate structure, an enhanced electric field and SSI effect can be maintained.

In addition, since the storage node is defined by the dummy layer, and the spacer-shaped control gates are formed on the top surface and at least one sidewall of the storage node, the cell size can be smaller than that of the conventional split gate structure, and high scalability can be achieved.

Moreover, since the size of the storage node is adjusted according to the thickness of conductive spacers, high scalability can be achieved. Since the flash memory device of the present invention allows two gates to share one a common source, integration density can be increased and the device is further applicable as a NOR flash memory device.

While the present invention has been particularly shown and described with reference to exemplary embodiments thereof, it will be understood by those of ordinary skill in the art that various changes in form and details may be made herein without departing from the spirit and scope of the present invention as defined by the following claims.

What is claimed is:

1. A method of manufacturing a flash memory device, the method comprising:
    forming a storage node layer on a semiconductor substrate;
    after forming the storage node layer, forming a dummy layer within the storage node layer to separate the storage node layer into at least two storage nodes; and
    forming spacer-shaped control gates on both sidewalls of the dummy layer so that each control gate covers a sidewall and a top surface of a corresponding storage node.

2. The method of claim 1, further comprising, before and after the forming of the storage node, forming an insulating layer.

3. The method of claim 1, wherein the forming of the storage node layer and the forming of the dummy layer comprise:
- sequentially stacking a semiconductor tunnel oxide layer, a storage node layer, and a gate insulating layer;
- forming a damascene molding layer on the gate insulating layer;
- forming a patterned dummy layer using a damascene method so that the dummy layer partially passes through the damascene molding layer, the gate insulating layer, the storage node layer, and the tunnel oxide layer;
- removing the damascene molding layer;
- forming dummy spacers on both sidewalls of the dummy layer; and
- patterning the gate insulating layer, the storage node layer, and the tunnel oxide layer using the dummy spacers as masks; and
- removing the dummy spacers.

4. The method of claim 3, wherein the forming of the control gates comprises:
- forming a gate insulating layer on sidewalls of the dummy layer and a surface of the semiconductor substrate;
- forming conductive spacers on the sidewalls of the dummy layer coated with the gate insulating layer; and
- removing the dummy layer.

5. The method of claim 1, wherein the forming of the storage node layer and the forming of the dummy layer comprise:
- sequentially stacking a semiconductor tunnel oxide layer, a storage node layer, and a gate insulating layer;
- forming a damascene molding layer on the gate insulating layer;
- forming a patterned dummy layer using a damascene method so that the dummy layer partially passes through the damascene molding layer, the gate insulating layer, the storage node layer, and the tunnel oxide layer;
- removing the damascene molding layer;
- forming first conductive spacers on both sidewalls of the dummy layer; and
- patterning the gate insulating layer, the storage node layer, and the tunnel oxide layer using the first conductive spacers as masks.

6. The method of claim 5, wherein the forming of the control gates comprises:
- forming a gate insulating layer on sidewalls of the first conductive spacers, a sidewall of each storage node, and a surface of the semiconductor substrate;
- forming a second conductive spacer on a sidewall of each of the first conductive spacers coated with the gate insulating layer; and removing the dummy layer.

7. The method of claim 6, further comprising, after the forming of the control gates, forming a silicide layer that electrically connects the first conductive spacer and the second conductive spacer.

8. The method of claim 1, wherein the forming of the storage node layer and the forming of the dummy layer comprise:
- sequentially stacking a semiconductor tunnel oxide layer, a storage node layer, and a gate insulating layer;
- forming a damascene molding layer on the gate insulating layer;
- forming a patterned dummy layer using a damascene method so that the dummy layer partially passes through the damascene molding layer, the gate insulating layer, the storage node layer, and the tunnel oxide layer;
- removing the damascene molding layer;
- forming first conductive spacers on both sidewalls of the dummy layer;
- patterning the gate insulating layer, the storage node layer, and the tunnel oxide layer using the first conductive layers as masks; and removing the dummy layer.

9. The method of claim 8, wherein the forming of the control gates comprises:
- forming a gate insulating layer on the resultant semiconductor substrate; and
- forming second conductive spacers on both sidewalls of each of the first conductive spacers coated with the gate insulating layer.

10. The method of claim 8, further comprising, after the forming of the control gates, forming a silicide layer that electrically connects the first conductive spacers and the second conductive spacers.

11. A method of manufacturing a flash memory device, the method comprising:
- forming a storage node layer on a semiconductor substrate;
- forming a dummy layer within the storage node layer to separate the storage node layer into at least two storage nodes, wherein the forming of the storage node layer and the forming of the dummy layer comprise:
  - sequentially stacking a semiconductor tunnel oxide layer, a storage node layer, and a gate insulating layer;
  - forming a damascene molding layer on the gate insulating layer;
  - forming a patterned dummy layer using a damascene method so that the dummy layer partially passes through the damascene molding layer, the gate insulating layer, the storage node layer, and the tunnel oxide layer;
  - removing the damascene molding layer;
  - forming dummy spacers on both sidewalls of the dummy layer;
  - patterning the gate insulating layer, the storage node layer, and the tunnel oxide layer using the dummy spacers as masks; and
  - removing the dummy spacers; and
- forming spacer-shaped control gates on both sidewalls of the dummy layer so that each control gate covers a sidewall and a top surface of a corresponding storage node.

12. The method of claim 11, wherein the forming of the control gates comprises:
- forming a gate insulating layer on sidewalls of the dummy layer and a surface of the semiconductor substrate;
- forming conductive spacers on the sidewalls of the dummy layer coated with the gate insulating layer; and
- removing the dummy layer.

13. A method of manufacturing a flash memory device, the method comprising:
- forming a storage node layer on a semiconductor substrate;
- forming a dummy layer within the storage node layer to separate the storage node layer into at least two storage nodes, wherein forming the storage node layer and forming the dummy layer comprise:
  - sequentially stacking a semiconductor tunnel oxide layer, a storage node layer, and a gate insulating layer;

forming a damascene molding layer on the gate insulating layer;

forming a patterned dummy layer using a damascene method so that the dummy layer partially passes through the damascene molding layer, the gate insulating layer, the storage node layer, and the tunnel oxide layer;

removing the damascene molding layer;

forming first conductive spacers on both sidewalls of the dummy layer; and patterning the gate insulating layer, the storage node layer, and the tunnel oxide layer using the first conductive spacers as masks; and forming spacer-shaped control gates on both sidewalls of the dummy layer so that each control gate covers a sidewall and a top surface of a corresponding storage node.

14. The method of claim 13, wherein the forming of the control gates comprises:

forming a gate insulating layer on sidewalls of the first conductive spacers, a sidewall of each storage node, and a surface of the semiconductor substrate;

forming a second conductive spacer on a sidewall of each of the first conductive spacers coated with the gate insulating layer; and removing the dummy layer.

15. The method of claim 14, further comprising, after the forming of the control gates, forming a silicide layer that electrically connects the first conductive spacer and the second conductive spacer.

16. A method of manufacturing a flash memory device, the method comprising:

forming a storage node layer on a semiconductor substrate;

forming a dummy layer within the storage node layer to separate the storage node layer into at least two storage nodes, wherein forming the storage node layer and forming the dummy layer comprise:

sequentially stacking a semiconductor tunnel oxide layer, a storage node layer, and a gate insulating layer;

forming a damascene molding layer on the gate insulating layer;

forming a patterned dummy layer using a damascene method so that the dummy layer partially passes through the damascene molding layer, the gate insulating layer, the storage node layer, and the tunnel oxide layer;

removing the damascene molding layer;

forming first conductive spacers on both sidewalls of the dummy layer;

patterning the gate insulating layer, the storage node layer, and the tunnel oxide layer using the first conductive layers as masks; and removing the dummy layer; and forming spacer-shaped control gates on both sidewalls of the dummy layer so that each control gate covers a sidewall and a top surface of a corresponding storage node.

17. The method of claim 16, wherein the forming of the control gates comprises:

forming a gate insulating layer on the resultant semiconductor substrate; and forming second conductive spacers on both sidewalls of each of the first conductive spacers coated with the gate insulating layer.

18. The method of claim 16, further comprising, after the forming of the control gates, forming a silicide layer that electrically connects the first conductive spacers and the second conductive spacers.

* * * * *